(12) United States Patent
Strukov et al.

(10) Patent No.: US 8,735,858 B2
(45) Date of Patent: May 27, 2014

(54) IONIC DEVICES WITH INTERACTING SPECIES

(75) Inventors: Dmitri B. Strukov, Mountain View, CA (US); Alexandre M. Bratkovski, Mountain View, CA (US); R. Stanley Williams, Portola Valley, CA (US); Zhiyong Li, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/383,616

(22) PCT Filed: Apr. 30, 2010

(86) PCT No.: PCT/US2010/033257
§ 371 (c)(1),
(2), (4) Date: Jan. 12, 2012

(87) PCT Pub. No.: WO2011/136806
PCT Pub. Date: Nov. 3, 2011

(65) Prior Publication Data
US 2013/0037773 A1 Feb. 14, 2013

(51) Int. Cl.
*H01L 29/02* (2006.01)
*H01L 47/00* (2006.01)
*H01L 23/58* (2006.01)
*H01L 21/326* (2006.01)
*H01L 21/479* (2006.01)
*H01L 21/425* (2006.01)

(52) U.S. Cl.
USPC ............ 257/2; 257/4; 257/798; 257/E21.498; 257/E45.002; 257/468; 257/527; 257/533

(58) Field of Classification Search
USPC .................. 257/2, 798, 4, E21.498, E45.002; 438/468, 527, 533
See application file for complete search history.

(56) References Cited

U.S. PATENT DOCUMENTS

| 4,864,141 A | * | 9/1989 | Lewiner ........................ 250/381 |
| 4,917,472 A | * | 4/1990 | Margerum et al. ............ 349/130 |
| 6,049,733 A | * | 4/2000 | Phipps et al. .................... 604/20 |
| 6,291,102 B1 | * | 9/2001 | Yoshida et al. .......... 429/231.95 |
| 6,563,625 B1 | * | 5/2003 | Athenstaedt et al. ......... 359/265 |
| 6,822,778 B2 | * | 11/2004 | Westfall et al. ............... 359/265 |

(Continued)

FOREIGN PATENT DOCUMENTS

| KR | 10-2003-0085002 | 11/2003 |
| KR | 10-0913681 | 8/2009 |

OTHER PUBLICATIONS

Andreasson, B.P. et al., "Spatial distribution of oxygen vacancies in Cr-doped SrTiO3 during an electric-field-driven insulator-to-metal transition" Applied Physics Letters, vol. 94, pp. 013513-1 to 013513-3 (2009).

(Continued)

*Primary Examiner* — Ida M Soward

(57) ABSTRACT

An ionic device includes a layer of an ionic conductor containing first and second species of impurities. The first species of impurity in the layer is mobile in the ionic conductor, and a concentration profile of the first species determines a functional characteristic of the device. The second species of impurity in the layer interacts with the first species within the layer to create a structure that limits mobility of the first species in the layer.

17 Claims, 3 Drawing Sheets

(56) References Cited

U.S. PATENT DOCUMENTS

| | | | | |
|---|---|---|---|---|
| 6,942,772 | B1* | 9/2005 | Schneider et al. | 204/424 |
| 7,419,314 | B2* | 9/2008 | Kaneiwa et al. | 396/506 |
| 7,514,013 | B2* | 4/2009 | Logan et al. | 216/11 |
| 7,553,573 | B2* | 6/2009 | Visco et al. | 429/482 |
| 7,741,147 | B2* | 6/2010 | Kiesel et al. | 438/104 |
| 7,838,457 | B2* | 11/2010 | Katori et al. | 502/101 |
| 8,058,643 | B2* | 11/2011 | Meyer et al. | 257/27 |
| 8,188,455 | B2* | 5/2012 | Tsukamoto et al. | 257/5 |
| 8,207,518 | B2* | 6/2012 | Kubo et al. | 257/2 |
| 8,304,115 | B1* | 11/2012 | Petkov et al. | 429/304 |
| 8,436,330 | B2* | 5/2013 | Kamins et al. | 257/2 |
| 8,471,234 | B2* | 6/2013 | Tong et al. | 257/4 |
| 2003/0053350 | A1 | 3/2003 | Krieger et al. | |
| 2005/0269267 | A1* | 12/2005 | Patton et al. | 210/656 |
| 2008/0023333 | A1* | 1/2008 | Johnson | 204/554 |
| 2008/0084653 | A1* | 4/2008 | Pinnow | 361/525 |
| 2009/0029237 | A1* | 1/2009 | Yazami | 429/50 |
| 2009/0075146 | A1* | 3/2009 | Striker et al. | 429/33 |
| 2009/0179245 | A1* | 7/2009 | Karg et al. | 257/295 |
| 2009/0303772 | A1 | 12/2009 | Rinerson et al. | |
| 2010/0075194 | A1* | 3/2010 | Jain et al. | 429/33 |
| 2010/0164330 | A1* | 7/2010 | Komatsu et al. | 310/365 |
| 2011/0007555 | A1* | 1/2011 | Ito | 365/148 |
| 2011/0108952 | A1* | 5/2011 | Chen | 257/595 |
| 2011/0192729 | A1* | 8/2011 | Stancovski | 205/335 |
| 2013/0128332 | A1* | 5/2013 | Andersson et al. | 359/266 |

OTHER PUBLICATIONS

Cabrera, N. et al., "Theory of the Oxidation of Metals" Rep. Progr. Phys., vol. 12, pp. 163-184 (1948).

Cummins, D. et al., "Ultrafast Electrochromic Windows Based on Redox-Chromophore Modified Nanostructured Semiconducting and Conducting Films" J. Phys. Chem. B, vol. 104, No. 48, pp. 11449-11459 (2000).

Hagfeldt, A. et al., "Fast Electrochromic Switching With Nanocrystalline Oxide Semiconductor Films" J. Electrochem. Soc., vol. 141, No. 7, pp. L82-L84 (1994).

Jameson, J.R. et al., "Field-programmable rectification in rutile TiO2 crystals" Applied Physics Letters, vol. 91, pp. 112101-1 to 112101-3 (2007).

Strukov, D. et al., "The Missing Memristor Found" Nature, vol. 453, pp. 80-83 (2008).

Strukov, D. et al., "Coupled Ionic and Electronic Transport Model of Thin-Film Semiconductor Memristive Behavior" Small, No. X, pp. 1-6 (2009).

Strukov, D. et al., "Exponential ionic drift: fast switching and low volatility of thin-film memristors" Applied Physics A, vol. 94, pp. 515-519 (2009).

Waser, R. et al., "Redox-based Resistive Switching Memories—Nanoionic Mechanisms, Prospects, and Challenges" Advanced Materials, vol. 21, pp. 2632-2663 (2009).

Waser, R. et al., "Nanoionics-based Resistive Switching Memories" Nature Materials, vol. 6, pp. 833-840 (2007).

Yan, M.F. et al., "Effects of Cation Contaminants in Conductive TiO2 Ceramics" Journal of Applied Physics, vol. 53, No. 12, pp. 8809-8818 (1982).

Yang, J.J. et al., "Memristive Switching Mechanism for Metal/oxide/metal Nanodevices" Nature Nanotechnology, vol. 3, pp. 429-433 (2008).

* cited by examiner

IONIC DEVICES WITH INTERACTING SPECIES

BACKGROUND

Recently developed ionic devices rely on the movement of ions in ionic conductors to change electrical or other properties of the ionic devices. For example, FIG. 1A shows an ionic device 100, which includes a layer or film 120 of an ionic conductor that is sandwiched between two electrodes 110 and 130. For example, ionic conductor 120 may be a layer of titanium dioxide ($TiO_2$), while ions 126 are oxygen vacancies, i.e., gaps in the crystal structure where oxygen ions are missing. With titanium dioxide and oxygen vacancies, ionic device 100 can behave as a memristor because a voltage difference applied between electrodes 110 and 130 can cause ion currents that move oxygen vacancies and significantly alter the electrical resistance of ionic conductor 120. For a display device, ionic conductor 120 can be a layer of tungsten trioxide ($WO_3$), while ions 126 are lithium ions which are sufficiently mobile in tungsten trioxide to move in response to an applied voltage. Pure tungsten trioxide is clear, but lithium impurities give tungsten trioxide a blue color. Accordingly, ion currents that move lithium ions to or away from a display surface can change the color of ionic device 100.

FIG. 1A shows a configuration of device 100 where ions 126 are concentrated near one electrode 110. Layer 120 may initially be formed in this configuration by forming two layers 122 and 124 with distinct compositions, e.g., where one layer 122 is of a primary material such as titanium dioxide $TiO_2$ and the other layer 124 is of a source material such as oxygen-depleted titanium dioxide $TiO_{2-x}$. Application of a voltage having the proper polarity and sufficient magnitude between electrodes 110 and 130 can then drive an ion current that moves ions 126 from layer 124 into layer 122 to switch from the state of device 100 shown in FIG. 1A where ions concentrated near electrode 110 to the state of device 100 in FIG. 1B where more ions 126 are dispersed throughout ionic conductor 120 or even to the state of FIG. 1C where ions 126 are highly concentrated near electrode 120. Device 100 can similarly switch back from the state of FIG. 1B or 1C to the state of FIG. 1A by application of an opposite polarity voltage of sufficient magnitude to drive an ion current that moves ions 126 toward electrode 110. This operation is possible because ionic conductor 120 provides sufficient mobility for ions 126 that are capable of significantly altering the properties of ionic conductor 120 and device 100 as a whole.

Non-volatile operation of ionic devices such as device 100 is often desired. For example, for use as a non-volatile memristive memory, device 100 might have a high voltage applied with a polarity selected to switch device 100 to the high resistance state corresponding to FIG. 1A or 1C or a low resistance state corresponding to FIG. 1B in order to write a binary value 0 or 1 to device 100. A lower voltage that causes an electron current but minimal ion movement can then be used to detect or measure the resistance of device 100 and read the binary value previously written. However, the mobility of ions in ionic conductor 120 permits some movement of ions when read voltage is applied for a read operation and even when no external voltage is applied. Typically, an ionic device has only one stable ionic concentration profile (e.g., uniform distributed ions of FIG. 1B) corresponding to the thermodynamic equilibrium and an ionic device tends to relax, e.g. by diffusion, toward the stable concentration profile. The rate at which an ionic device will relax can be significant. For example, drift-diffusion, which controls the relaxation time, may be just V times slower than the ion current during switching, where V is the applied switching voltage in units of thermal voltage $V_T = k_B T/e$ where $k_B$ is the Boltzmann constant, e is the electron charge and T is the temperature. For typical voltages used for the thin film ionic devices, the ratio of relaxation time to switching time may only be a few thousands, so that fast switching devices may have poor non-volatile retention. In many applications, both fast switching and long retention times are desired.

BRIEF DESCRIPTION OF THE DRAWINGS

Use of the same reference symbols in different figures indicates similar or identical items.

DETAILED DESCRIPTION

In accordance with an aspect of the invention, an ionic device can employ two or more interacting species of impurities including at least one ionic species that migrates in response to an applied voltage to change a state and operating characteristic of the ionic device. Further, the interaction of the species in an ionic conductor creates an immobile or less mobile structure (e.g., a molecule) that effectively changes the mobility of the active ions and improves the non-volatile characteristics of the ionic device. For example, two species of ions that are mobile within the ionic conductor can form a dumbbell (double) stable defect or a molecule that is relatively immobile in the ionic conductor. As a result, the state of the ionic device can be highly stable. However, when a high enough voltage is applied, the bonds between the interacting species are broken, freeing mobile ions and facilitating fast switching. Accordingly, such devices can combine both fast, low-power switching with long retention times.

Figure 1A:
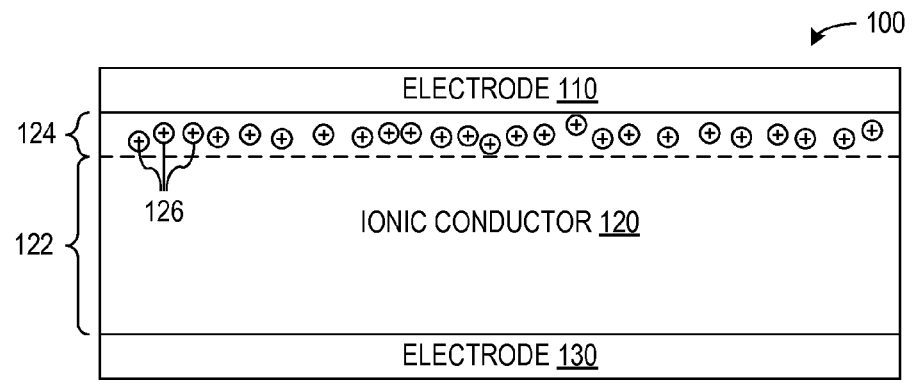
FIGS. 1A, 1B, and 1C are cross-sectional views of a known ionic device in different conductivity states.
Figure 1B:
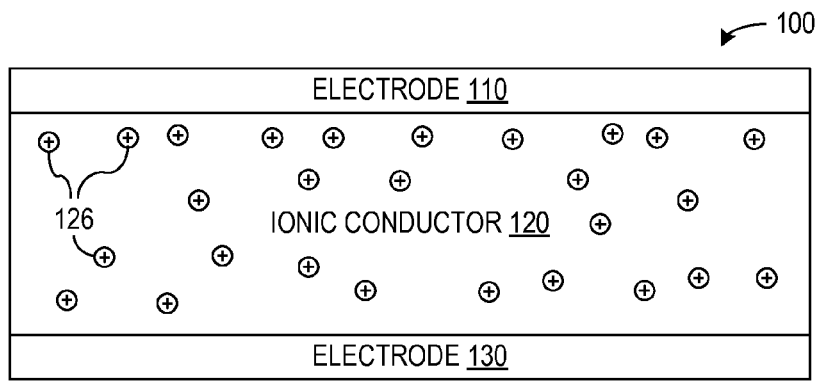
Figure 1C:
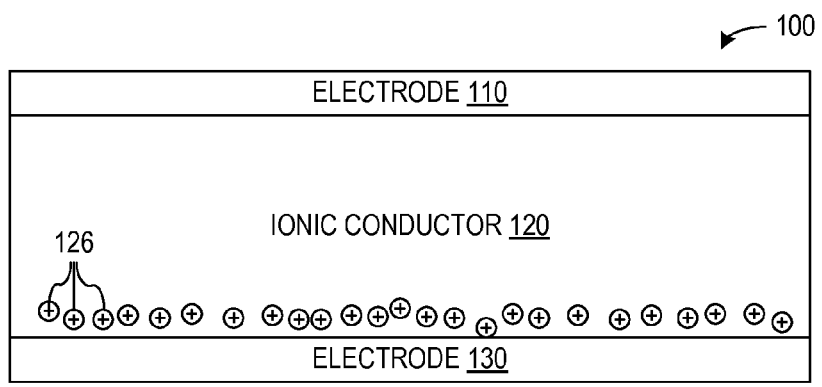
Figure 2A:
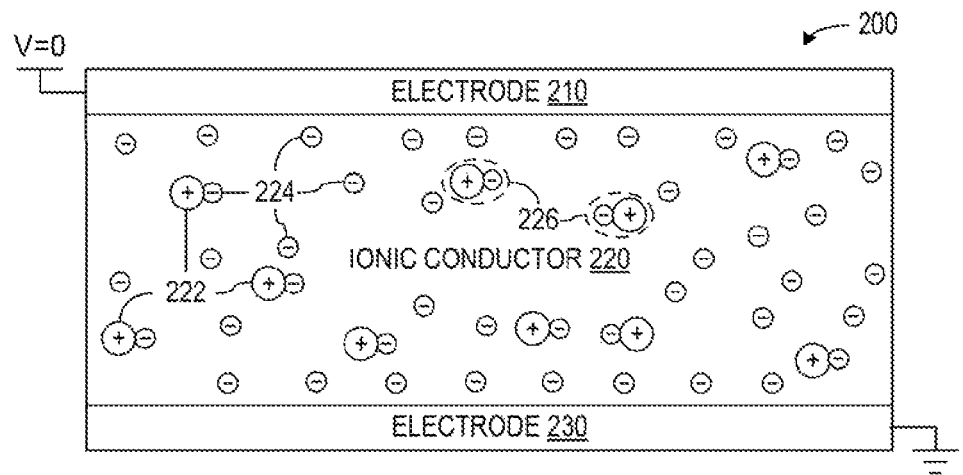
FIGS. 2A, 2B, and 2C are cross-sectional views of an ionic device in accordance with an embodiment of the invention employing interacting species of ions.

FIG. 2A shows a cross sectional view of an ionic device 200 including parallel electrodes 210 and 230 with a thin intervening layer of an ionic conductor 220 containing two species of reactants 222 and 224. Species 222 and 224 can be different types of ions, particularly ions of opposite charge, but in some embodiments one species 224 may be an uncharged chemical reactant or have the same charge as ions 222. Species 222, however, is, in some embodiments, charged and mobile in layer 220 so that applied electric fields or bias voltages can move ions 222 and change an operational characteristic of device 200. Species 222 and 224 should further be such that the operational characteristic of device 200 depends on the concentration profile of species 222, and ions 224 do not interfere with desired operation of device 200. For example, device 200 could have one electronic or optical characteristic when the concentration of species 222 near an electrode 210 or 230 is high and a very different electronic or optical characteristic when species 222 is more uniformly distributed in ionic conductor 220 or when species 222 is concentrated near the opposite electrode 230 or 210. Additionally, species 222 and 224 can form bonds creating atomic structures 226, e.g., a molecule or dumbbell detect, that is immobile in ionic conductor 220 or at least has a much less mobility in ionic conductor 220 than does species 220. In general, the interaction of species forms structure 226 while releasing a corresponding energy of reaction ΔU and breaking the bonds of structures 226 to free species 222 and 224 requires input of energy ΔU.

Figure 2B:
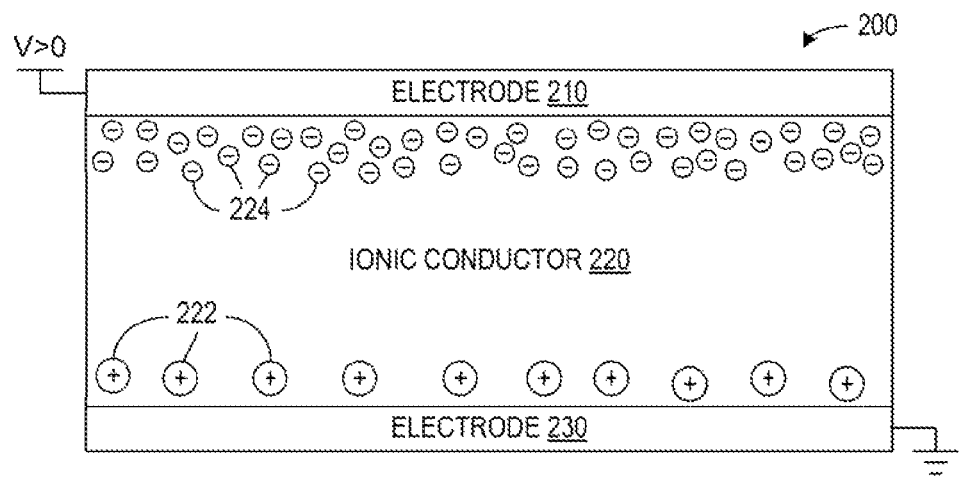
Figure 2C:
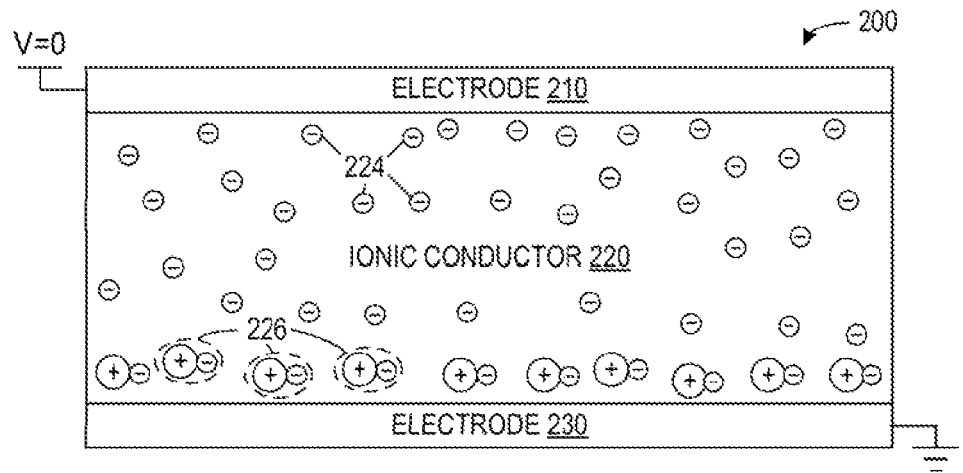

In the embodiment of FIGS. 2A, 2B, and 2C, both species 222 and 224 are ions, and the charge of ions 222 is opposite in polarity to the charge of ions 224. Ions 222 are sometimes referred to herein as active ions 222 because ions 222 are required to change the operational characteristic of ionic device 222. Ions 224 are sometimes referred to herein as binding ions 224 since ions 224 are not required to directly change the functional characteristic of ionic device 200 except by binding to active ions 222 and restricting the mobility of active ions 222.

In an exemplary memristive embodiment of device 200, layer 220 is a substance such as titanium dioxide and active ions 220 are oxygen vacancies in the titanium dioxide. Pure titanium dioxide ($TiO_2$) is an insulator, but introduction of oxygen vacancies, even at relatively low concentrations, causes titanium dioxide to be a semiconductor. Accordingly, as a memristor, ionic device 200 has a low resistance state associated with the distribution of ions 222 extending across the thickness of layer 220 as shown in FIG. 2A. In contrast, a high resistance state results when ions 222 are concentrated near an electrode as shown in FIGS. 2B and 2C because an extended thickness of layer 220 is then an insulator or high resistance semiconductor. The oxygen vacancies can effectively be bound to negative ions (acceptor impurities) such, as carbon or silicon in layer 220. However, silicon is an immobile impurity in titanium dioxide $TiO_2$, so that carbon may be preferred in embodiments where species 224 is mobile.

In an exemplary display application, device 200 is a cell in a display, and ionic conductor 230 is a material that changes color when ions 220 are introduced. For example, pure tungsten trioxide is transparent but turns blue when lithium ions are introduced. Accordingly, for a display, different colors can be produced by ion device 200 depending on whether ions 222 are more uniformly dispersed in layer 220 as shown in FIG. 2A, concentrated near the bottom electrode 230 as shown in FIG. 2B or 2C, or concentrated near the top electrode (not shown). For example, one electrode 210 or 230 can be a transparent conductor such as indium tin oxide and the color of layer 220 viewed through the transparent electrodes will depend on the concentration of ions 222 near the display electrode 210 or 230. Lithium as active ions 224 can be bound by species 222 when species 222 are, negative ions or acceptor atoms such as Niobium (Nb) in a tungsten trioxide layer.

FIG. 2B shows a state of ionic device 200 after a voltage V has been applied to device 200 between electrodes 210 and 230. Voltage V is positive voltage that is sufficiently high to disassociate ion species 222 and 224 that were bound together in relatively immobile structures 226. Voltage V further attracts mobile negative ions to the positive terminal (specifically electrode 210 in FIG. 2B) and attracts mobile positive ions to the negative terminal (or electrode 230 in FIG. 2B). In the illustrated embodiment, ions 222, which are of the species that changes the functional character of device 200, are positively charged and are concentrated near negative electrode 230 in FIG. 2B, and ions 224 are negatively charged and are concentrated near positive electrode 210 in FIG. 2B. More generally, the ion species that activates or changes the operational character (e.g., resistance or color) of device 200 can be either positively or negatively charged and therefore may move in directions opposite to those described for the exemplary embodiment.

The time $t_S$ required for device 200 to switch from the state of FIG. 2A to that of FIG. 2B in general depends on the magnitude of voltage V, the mobility of ions 222, and the thickness of layer 220. Layer 220 is preferably between a few nanometers to a couple hundred of nanometers thick to provide fast switching at applied voltages on the order of a couple of volts. The mobility of ions 222 depend on the particular material used for layer 220 and the impurity corresponding to ions 222, but in typical ionic devices, switching times between 100 ns and a few milliseconds can be achieved.

Voltage V can be turned off when device 200 reaches the state of FIG. 2B, at which point mobile ions 222 and 224 can drift or diffuse from the positions of FIG. 2B toward respective equilibrium concentration profiles. The characteristic relaxation rate of each species 222 and 224 will generally differ depending on the mobility of ions 222 and 224 in layer 220. Relaxation with no applied voltage will generally be due to diffusion, but can be altered if surface charge collects at the interfaces with electrodes 210 and 23, for example, as a result of differences in electron bands in layer 220 and electrodes 210 and 230, chemical gradients in layer 220, or net charge in the bulk of layer 220. Device 200 is preferably such that ions 224 are more mobile than ions 222 and/or present in higher concentrations in layer 220 than are ions 222, so that ions 222 will diffuse at most a small distance before bonding with available ions 224 and being fixed in immobile structures 226.

FIG. 2C shows the state of device 200 resulting after the positive voltage V that brings, about the state of FIG. 2B is turned off. In the illustrated configuration, ions 224 are much more mobile than ions 222 and diffuse much more rapidly across layer 220. As a result, ions 222 are mostly bound in structures 226 near electrode 230. The state of ionic device 200 in FIG. 2C may correspond to a high resistance state or a different color state when compared to the state of device 200 shown in FIG. 2A.

The use of interacting species 224 improves the ratio of retention time $t_R$ to switching time $t_S$ when compared to, conventional ionic devices. In particular, the ratio of retention time $t_R$ to switching time $t_S$ for device 200 proportional to the quantity given in Equation 1. In Equation 1, V is the applied voltage during switching in units $k_B T/e$, where $k_B$ is the Boltzmann constant, T is the temperature, and e is the magnitude of the electron charge. Values ΔU and $U_A$ are energies in thermal units $k_B T$ in Equation 1. In particular, energy ΔU is the reaction energy for formation of molecule 226. Energy $U_A$ is the hopping activation energy of ions 224 in layer 220 and is less than the hopping activation energy $U_B$ of ions 222 in layer 220 when ions 224 are more mobile than ions 222 in layer 220. Concentration $n_A$ is the concentration of ions 222 and is much greater than the concentration $n_B$ of active ions 222.

$$t_R/t_S \propto V \exp[\Delta U - U_A]n_A \qquad \text{Equation 1}$$

The ratio $t_R/t_S$ can generally be improved by increasing the background concentration $n_A$ of species 224, increasing the difference between hopping activation energies of species 222 and 224, and/or increasing the difference between reaction energy ΔU and hopping activation energy $U_A$ of ions 224. The concentrations $n_A$ and $n_B$ are parameters of device 200 that can be adjusted provided that concentrations $n_A$ or $n_B$ within a range that provides the desired variation in the functional characteristics of device 200. The mobility, hopping energy, and reaction energy are inherent to the materials used and are relevant to the selection of materials for use in device 200. Ratio $t_R/t_S$ can also be improved by increasing the thickness of layer 220 but with the tradeoff of a slower switching time $t_S$.

Figure 3A:
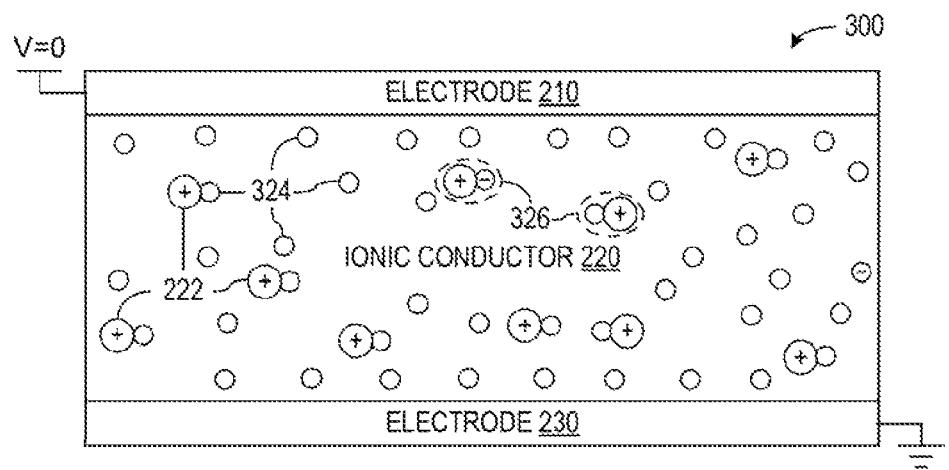
FIGS. 3A, 3B, and 3C are cross-sectional views of an ionic device in accordance with an embodiment of the invention employing interactions of mobile ions with a species that is either uncharged or immobile.
Figure 3B:
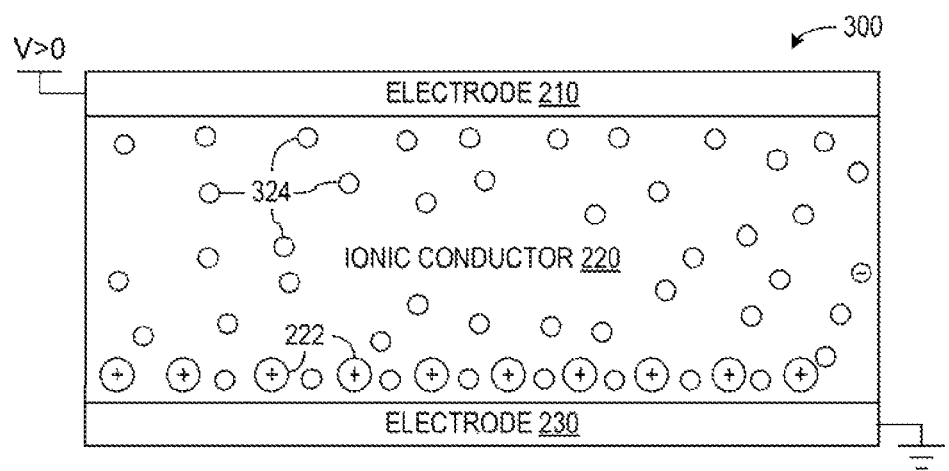
Figure 3C:
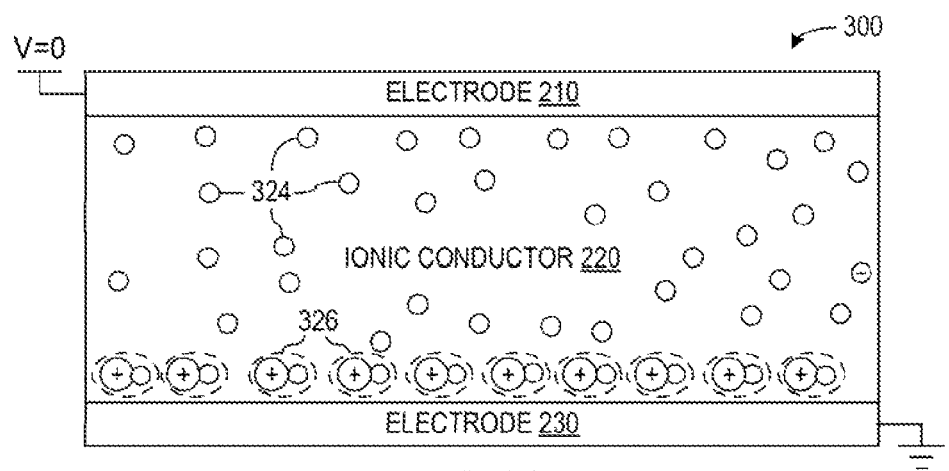

FIGS. 3A, 3B, and 3C shows different states of an ionic device 300 that employs an active ion species 222 and a binding species 324 that is either uncharged or immobile.

FIG. 3A shows a state of ionic device 300 in which species 222 and 324 are uniformly distributed a layer of ionic conductor 222. The number and concentration of binding species 324 is greater than the number and concentration of active ions 222, and as a result of exothermic reactions with binding ions 224, nearly all of the active ions 222 are bound to respective binding impurities 324 in molecular structures 326. The state of FIG. 3A may correspond to an equilibrium state of device 300 and also correspond to a low resistance state of device 300 when device 300 is memristive.

FIG. 3B shows how a voltage V of sufficient magnitude applied between electrodes 210 and 230 can disassociate or free active ions 222 from binding impurities 324 and attract the freed active ions 222 to the opposite polarity electrode 230 in FIG. 3B. Binding impurities 324 in this embodiment are either uncharged or immobile, and thus retain their fixed distribution if immobile or the equilibrium distribution resulting from diffusion in ionic conductor layer 220 when impurities are mobile but uncharged.

FIG. 3C illustrates how when the applied voltage is turned off, active ions 222 interact with binding impurities 326 to form structures 326 that are either immobile in ionic conductor 220 or less mobile in ionic conductor 220 than are free active ions 222. FIG. 3C specifically shows a state of device 300 in which active ions 222 are bound in atomic structures 326 with a high concentration near electrode 230, but more generally, once the applied voltage driving movement of active ions 222 is turned off, the reaction with binding species 324 distributed throughout layer 220 quickly binds active ions 222. The binding reaction can increase the retention time of any distribution of active ions 222 that can be achieved through application of bias voltages, while switching times for the states can still be rapid, being nearly the same as switching times associated with the mobility of free active ions 222.

Devices 200 and 300 as described above can employ a variety of different material combinations that provide devices 220 and 300 with electrically switched operational characteristics that can be retained for extended times after applied voltages are off. Some examples of materials for ionic conductor layer 220 in device 200 or 330 include any solid state mixed ionic/electronic semiconductor material and/or porous semiconductor material based on organic and inorganic compounds. For example, layer 220 could be titanium dioxide, tungsten trioxide, zirconium dioxide doped with calcium oxide and yttrium oxide, silver sulfide, silver iodide, copper iodide, or rubidium silver iodide to name a few. Combinations of impurity species 222 and 224 for device 200 could be any combination of mobile charged species where binding species 224 has significantly greater mobility in layer 220. Combinations of impurity species 222 and 324 for device 300 could be any combination of a mobile ionic species 222 and an uncharged or immobile binding species 324. For example, some relatively fast diffusing impurity species include elements such as H, Li, Ag, Pl, Au, Na, Ti, Cu, Ca, and K, and relatively slower impurity species include elements O (or oxygen vacancies), C, N, Si, and I, which can form ions or not depending on the composition of layer 220.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A device comprising:
    a layer of an ionic conductor;
    a first species of impurity in the layer, wherein the first species is mobile in the ionic conductor, and a concentration profile of the first species determines an operational characteristic of the device; and
    a second species of impurity in the layer, wherein the second species interacts with the first species within the layer to create a structure that limits mobility of the first species in the layer.

2. The device of claim 1, wherein the first species is charged and moves to change the concentration profile in response to a voltage applied across the layer.

3. The device of claim 2, wherein the structure that limits mobility of the first species becomes disassociated in response to the voltage applied across the layer.

4. The device of claim 2, wherein the second species has a charge of a polarity opposite to that of the first species.

5. The device of claim 2, wherein the second species is uncharged.

6. The device of claim 2, wherein the second species is immobile in the ionic conductor.

7. The device of claim 1, wherein the operational characteristic is a resistance or an optical property of the layer.

8. The device of claim 1, wherein an average concentration of the second species in the layer is higher than an average concentration of the first species in the layer.

9. The device of claim 1, wherein the second species has a mobility in the layer that is higher than a mobility of the first species in the layer.

10. The device of claim 1, wherein the device is a memristive memory device.

11. The device of claim 1, wherein the device is a display device.

12. The device of claim 1, wherein the ionic conductor comprises a material selected from a group consisting of titanium dioxide, tungsten trioxide, zirconium dioxide, silver sulfide, silver iodide, copper iodide, or rubidium silver iodide.

13. The device of claim 1, wherein the first species of impurity comprises a material selected from the group consisting of hydrogen, lithium, silver, platinum, gold, sodium, titanium, copper, calcium, and potassium.

14. The device of claim 1, wherein the second species of impurity comprises a material selected from the group consisting of oxygen, oxygen vacancies, carbon, nitrogen, silicon, and iodine.

15. A method comprising:
    applying a bias voltage across a layer of ionic conductor that contains a first species of impurity and a second species of impurity that are bound together, wherein the first species is charged and the bias voltage is sufficient to free impurities of the first species from respective bonds with impurities of the second species; and
    maintaining the bias voltage for a time period sufficient to move the first species from a first distribution that gives the ionic device a first operational characteristic to a second distribution that gives the ionic device a second operational characteristic; and
    reacting the first species when in the second distribution with the second species to bind impurities of the first species with respective impurities of the second species and reduce mobility of the first species in the layer.

16. The method of claim 15, the second species is charged with a sign opposite to the charge of the first species, and the second species is more mobile in the layer than is the first species.

17. The method of claim 15, wherein a distribution of the second species in the layer remains constant during applying and maintaining of the bias voltage.

* * * * *